US 6,670,697 B2

(12) United States Patent
Hasegawa (10) Patent No.: US 6,670,697 B2
(45) Date of Patent: Dec. 30, 2003

(54) SEMICONDUCTOR DEVICE MODULE FRAME AND GROUP THEREOF (75) Inventor: Shinichi Hasegawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/794,029

(22) Filed: Feb. 28, 2001

(65) Prior Publication Data
US 2002/0047197 A1 Apr. 25, 2002

(30) Foreign Application Priority Data
Oct. 20, 2000 (JP) ......................... 2000-320576

(51) Int. Cl.⁷ .............................................. H01L 23/495
(52) U.S. Cl. ......................................... 257/670; 257/676
(58) Field of Search ................................. 438/111, 112, 438/366, 367; 257/666–677, 777; 29/832, 840; 174/52.2, 250, 255, 52.1; 361/802

(56) References Cited

U.S. PATENT DOCUMENTS

| 4,258,381 A | * | 3/1981 | Inaba | |
| 4,887,352 A | | 12/1989 | Adams | 29/827 |
| 5,378,656 A | * | 1/1995 | Kajihara et al. | |
| 5,394,609 A | * | 3/1995 | Ferguson et al. | 29/840 |
| 5,661,339 A | * | 8/1997 | Clayton | 257/678 |
| 5,708,297 A | * | 1/1998 | Clayton | 257/723 |
| 5,731,633 A | * | 3/1998 | Clayton | 257/723 |
| 5,751,553 A | * | 5/1998 | Clayton | 361/749 |
| 5,866,852 A | * | 2/1999 | Benz et al. | 174/255 |
| 6,049,975 A | * | 4/2000 | Clayton | 29/832 |
| 6,091,145 A | * | 7/2000 | Clayton | 257/724 |
| 6,188,576 B1 | * | 2/2001 | Ali et al. | 361/704 |
| 6,232,659 B1 | * | 5/2001 | Clayton | 257/724 |
| 6,239,366 B1 | * | 5/2001 | Hsuan et al. | 174/52.3 |
| 6,343,020 B1 | * | 1/2002 | Lin et al. | 361/816 |
| 6,353,538 B1 | * | 3/2002 | Ali et al. | 361/728 |
| 6,362,966 B1 | * | 3/2002 | Ali et al. | 361/728 |
| 6,417,027 B1 | * | 7/2002 | Akram | 438/109 |
| 2002/0047197 A1 | * | 4/2002 | Hasegawa | 257/724 |
| 2002/0131245 A1 | * | 9/2002 | Clayton et al. | 361/736 |

FOREIGN PATENT DOCUMENTS

| DE | 3113031 A1 | * 10/1982 | .......... H05K/13/02 |
| JP | 63-169752 | 7/1988 | |
| JP | 404107933 | * 4/1992 | |
| JP | 5-226534 | 9/1993 | |

* cited by examiner

Primary Examiner—David E. Graybill
(74) Attorney, Agent, or Firm—Leydig, Voit & Mayer, Ltd.

(57) ABSTRACT

A semiconductor device module frame includes a semiconductor device module fabrication portion for fabricating a semiconductor device module corresponding to a substrate having an electronic component mounted thereon, a framework sandwiching the semiconductor device module fabrication portion in two opposite directions on opposite sides of the fabrication part and defining an outermost width of the frame, and ribs connecting the framework and the semiconductor device module fabrication portion together to fix their relative positional relationship. Preferably the framework has a positioning hole for positioning the semiconductor device module fabrication portion.

14 Claims, 8 Drawing Sheets

SEMICONDUCTOR DEVICE MODULE FRAME AND GROUP THEREOF

BACKGROUND OF THE INVENTION

1. Field of the Invention

The present invention relates to semiconductor device module frames for use for example in transporting and positioning a semiconductor device module in a semiconductor device module production line.

2. Description of the Background Art

In the present application a "semiconductor device" will refer to a single electronic component provided in the form of a chip, such as an integrated circuit (IC), a large scale integration (LSI) and the like. Furthermore, a "semiconductor device module" will refer to a substrate having mounted on a surface thereof an electronic component such as a semiconductor device, a capacitor, a connection terminal or the like. The "semiconductor device module" can typically be also referred to as a "mounted substrate", a "module substrate" or the like.

Figure 6:
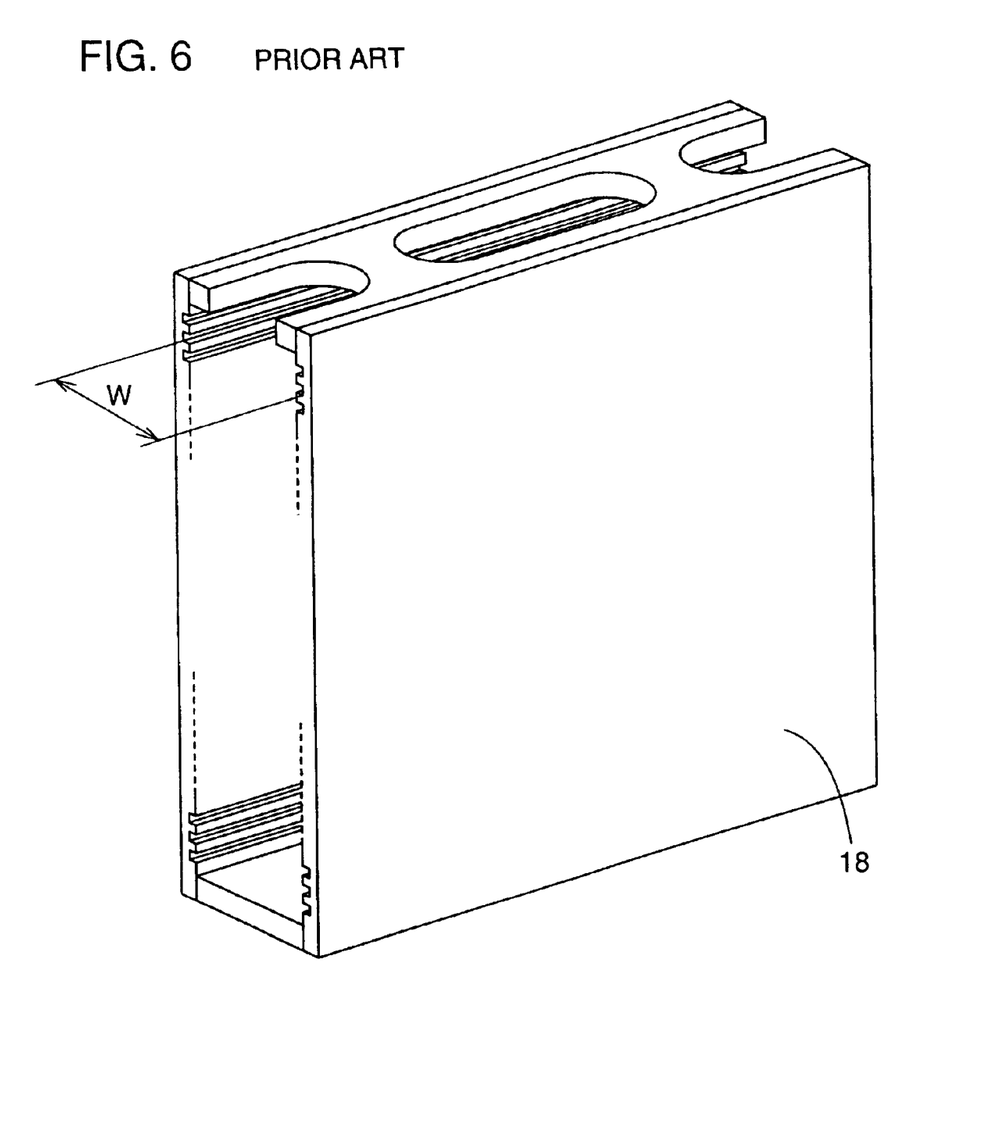
FIG. 6 is a perspective view of a magazine.
Figure 7:
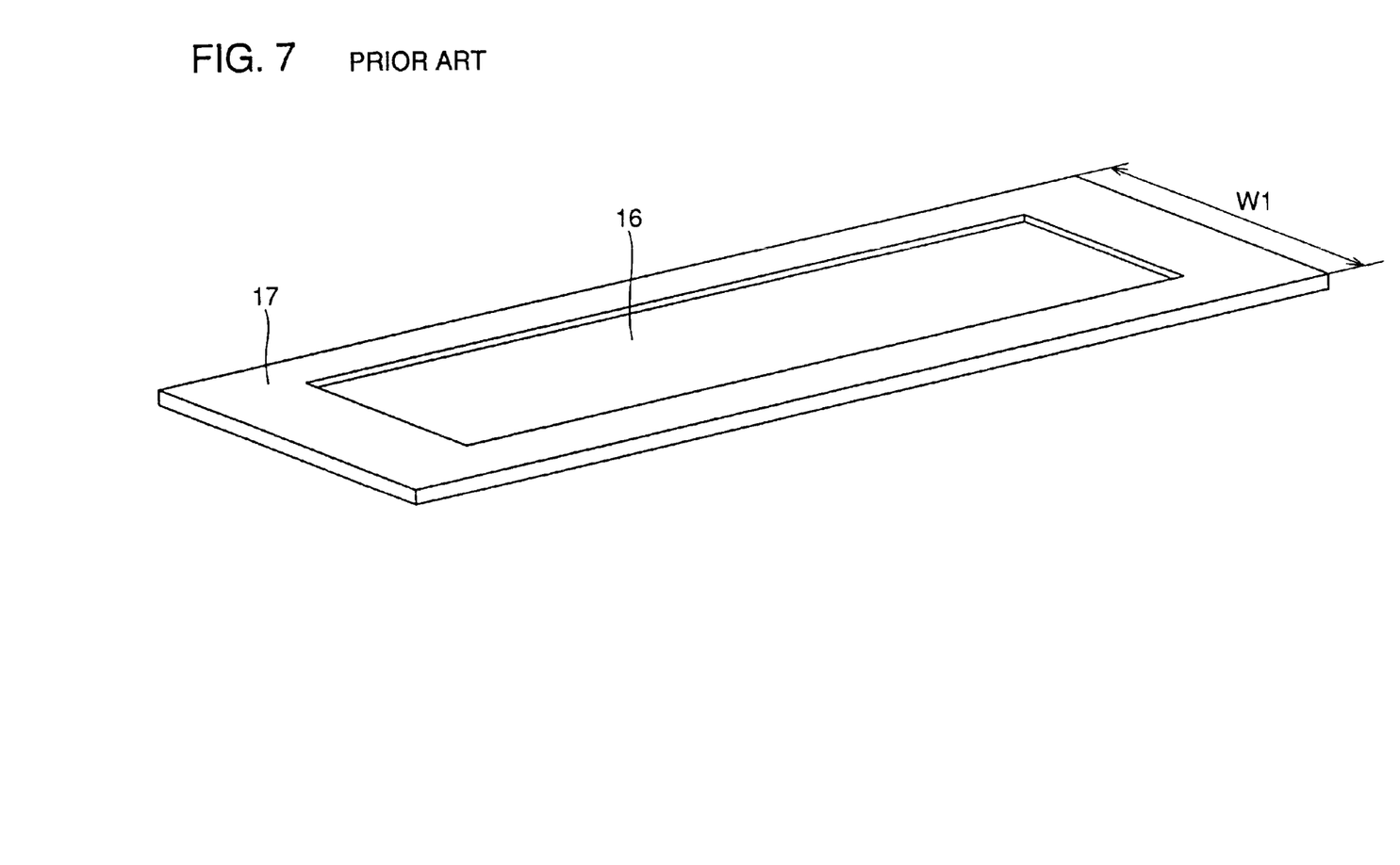
FIG. 7 is a perspective view of a holder used in conventional art.

Conventionally in fabricating a semiconductor device module a magazine 18 as shown in FIG. 6 and a holder 17 having a recess 16 as shown in FIG. 7 are used to successively transport to each process step a substrate 9 on which the module is to be formed. Recess 16 is shaped and sized to correspond to a geometry of substrate 9. Substrate 9 is accommodated in recess 16, fit thereinto.

Figure 8:
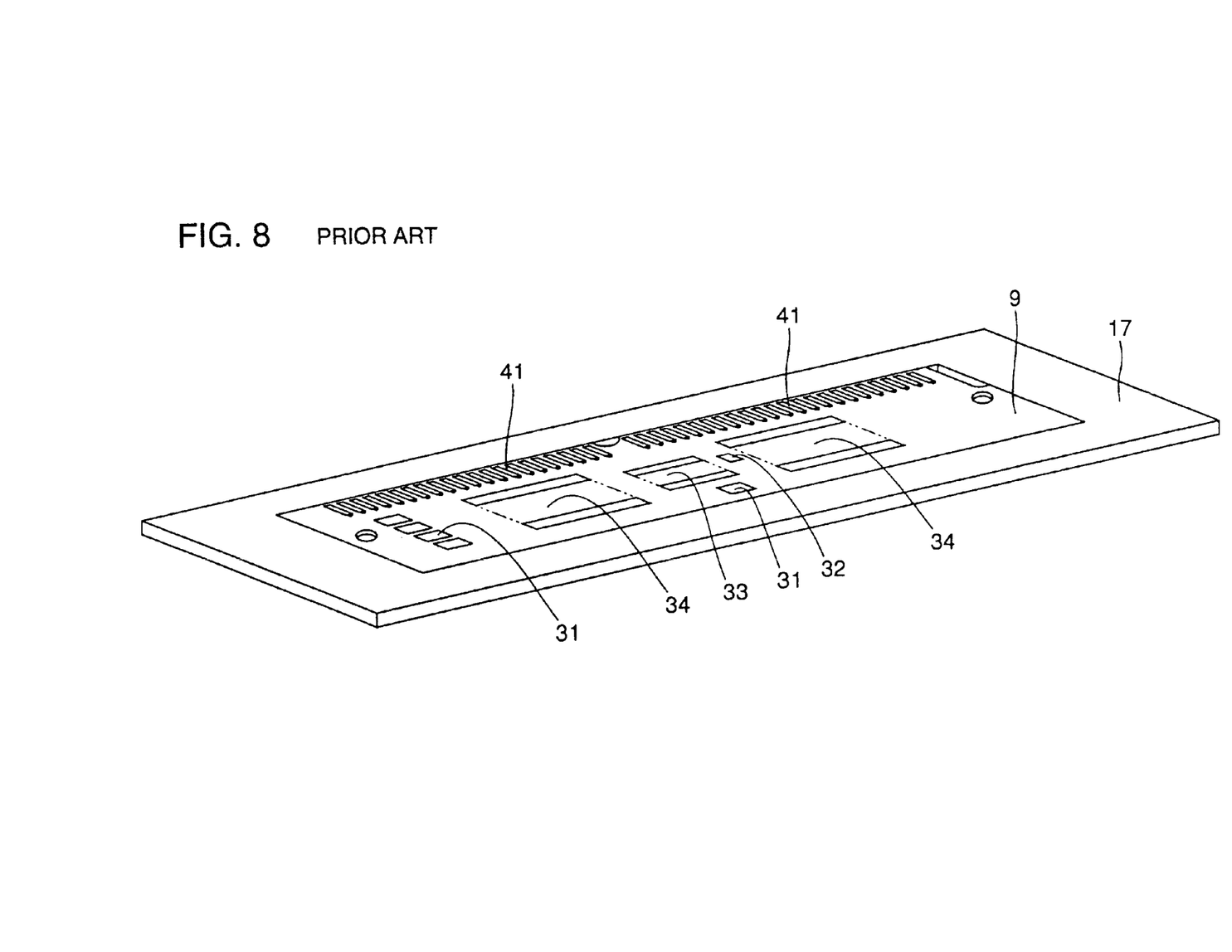
FIG. 8 is a perspective view of a conventional holder in use by way of example.

For example, substrate 9 has a surface provided for example with an external connection terminal 41, a capacitor mounting region 31 and 32, an IC mounting region 33 and 34. Substrate 9 is accommodated in holder 17 with the surface exposed upward, as shown in FIG. 8. In this condition, various electronic components are mounted, e.g., capacitors 51 and 52 are mounted in capacitor mounting regions 31 and 32 and ICs 53 and 54 are mounted in IC mounting regions 33 and 34.

Fitting and thus accommodating substrate 9 in holder 17, as shown in FIG. 8, allows substrate 9 together with holder 17 to be readily handled for example with a handler (not shown). Furthermore, holder 17 fixed in width can be housed in magazine 18 having a holder accommodating space fixed in width. Thus, a large number of holders 17 can be housed in magazine 18 to transport and store substrates.

Holder 17 used as above, however, must be changed if substrate 9 for a semiconductor device module to be fabricated varies in size, since holder 17 is required to have recess 16 corresponding thereto. To change holder 17, the production line is disadvantageously stopped or, to produce new holder 17, an extra cost is disadvantageously required.

The present invention contemplates a tool that can eliminate the necessity of using a holder to house a substrate in a magazine to allow various process steps to be provided smoothly without stopping the production line when a substrate varies in size.

SUMMARY OF THE INVENTION

To achieve the above object the present invention provides a semiconductor device module frame including a semiconductor device module fabrication area for fabricating a semiconductor device module corresponding to a substrate having an electronic component mounted thereon, a framework positioned to sandwich the semiconductor device module fabrication area in two directions and define an outermost width of the frame, and a rib connecting the framework and the semiconductor device module fabrication area together to fix their relative, positional relationship.

As such, rather than a substrate accommodated in a holder the form of a semiconductor device module frame can be handled as if it were a plate having a fixed outermost width. This can eliminate the necessity of preparing a different holder whatever size a semiconductor device module fabrication area has. Furthermore, whatever size a semiconductor device module to be fabricated has, a common transport unit, a common magazine and the like can be used and the frame can thus have a uniform outermost width.

In the present invention preferably the frame includes a positioning means for positioning the semiconductor device module fabrication area in processing the semiconductor device module fabrication area. This can facilitate positioning the semiconductor device module fabrication area to mount an electronic component thereon if on the semiconductor device module frame there does not still appear any outer peripheral geometry of the semiconductor device module itself.

In the present invention preferably the positioning means is a positioning hole. As such, the positioning means can be relatively readily formed. As such, with a simple structure the position of the frame can be confirmed.

In the present invention preferably the positioning hole is provided in the framework. As such, the semiconductor device module fabrication area can be prevented from having a positioning hole that would consume a valuable space on a substrate of a semiconductor device module. Since the semiconductor device module fabrication area does not have any positioning hole, the semiconductor device module can also be shaped with a level of precision free of any negative effects attributable to a positioning hole otherwise provided in the semiconductor device fabrication area.

In the present invention preferably the frame is structured such that simply cutting the rib allows the semiconductor device module fabrication area to be extracted as a semiconductor device module. As such, simple equipment can be used to rapidly extract a semiconductor device module from a semiconductor device module frame having processed, as required, including, e.g., mounting an electronic component thereon.

In the present invention preferably the semiconductor device module fabrication area includes an external connection terminal provided to externally connect the semiconductor device module and the external connection terminal is distant from the rib to prevent the external connection terminal from being functionally affected by cutting the rib. As such, cutting a semiconductor device module off and thus extracting the module to obtain it does not functionally damage an external connection terminal corresponding to a portion important to the semiconductor device module.

In the present invention preferably the frame includes an auxiliary framework sandwiching the semiconductor device module fabrication area in still another two directions, the auxiliary framework defining an outermost length of the frame. As such, the frame can have an outermost length defined whatever size a semiconductor device module fabrication area has. As such, rather than a substrate accommodated in a holder, the form of a semiconductor device module frame can be handled as if it were a plate fixed in outermost width and length. In particular, if a semiconductor device module to be fabricated significantly varies not only in width but also in length, a semiconductor device module frame can be defined to have a fixed outermost length. As a result, the frame can have a uniform outermost width and a uniform outermost length to allow a common transport unit, a common magazine and the like to be smoothly used whatever size a semiconductor device module to be fabricated has.

To achieve the above object, the present invention provides a group of semiconductor device module frames, including a plurality of semiconductor device module frames to fabricate in a plurality of forms a semiconductor device module corresponding to a substrate with an electronic component mounted thereon, each semiconductor device module frame including: a semiconductor device module fabrication area for fabricating a semiconductor device module corresponding thereto; a framework positioned to sandwich the semiconductor device module fabrication area in two directions and define an outermost width of the frame; and a rib connecting the framework and the semiconductor device module fabrication area together to fix a relative, positional relationship between the framework and the semiconductor device module fabrication area, wherein the plurality of semiconductor device module frames have the outermost width set to be uniform to have a single value or a plurality of limited values arranged in a graduated series.

As such, whatever size a semiconductor device module to be fabricated has, rather than a holder with a substrate held thereon the semiconductor device module frame can be handled as if it were a plate having a uniform outermost width. This can eliminate the necessity of preparing a different holder whatever size a semiconductor device module fabrication area has. As such, a common transport unit, a common magazine and the like can be used. It is thus not necessary to stop a production line whatever size a semiconductor device module to be fabricated has. As such the production line can be continuously operated.

In the present invention preferably each semiconductor device module frame includes a positioning means for positioning the semiconductor device module fabrication area in processing the semiconductor device module fabrication area. As such, the semiconductor device module fabrication area can be readily positioned for mounting an electronic component thereon if on individual frames of the group of semiconductor device module frames there does not still appear any outer peripheral geometry of semiconductor device modules themselves. As such, the production line can be automated more efficiently.

In the present invention preferably the positioning means is a positioning hole. As such, the group of semiconductor device module frames can be configured of individual frames relatively readily provided with the positioning means. As such, with a simple structure the position of each semiconductor device module frame can be confirmed. This can facilitate automating a production line.

In the present invention preferably the positioning hole is provided in the framework. As such, in the group of semiconductor device module frames the individual frames can each have a semiconductor device module fabrication area free of a positioning hole that would consume a valuable space on a substrate of a semiconductor device module. Since the semiconductor device module fabrication area does not have any positioning hole, the semiconductor device module can also be shaped with a level of precision free of any negative effects attributable to a positioning hole otherwise provided in the semiconductor device fabrication area.

In the present invention preferably each semiconductor device module frame is structured such that simply cutting the rib allows the semiconductor device module fabrication area to be extracted as a semiconductor device module. As such, simple equipment can be used to extract a semiconductor device module from an individual semiconductor device module frame having processed, as required, including, e.g., mounting an electronic component thereon.

In the present invention preferably the semiconductor device module fabrication area includes an external connection terminal provided to externally connect the semiconductor device module and the external connection terminal is distant from the rib to prevent the external connection terminal from being functionally affected by cutting the rib. As such, cutting a semiconductor device module off an individual one of the grouped semiconductor device module frames and thus extracting the module to obtain it, does not functionally damage an external connection terminal corresponding to a portion important to the semiconductor device module.

In the present invention preferably each semiconductor device module frame includes an auxiliary framework sandwiching the semiconductor device module fabrication area in still another two directions, the auxiliary framework defining an outermost length of the frame. As such, the outermost length can be defined whatever size a semiconductor device module fabrication area has. As such, rather than a holder with a substrate housed therein, the form of a semiconductor device module frame can be handled as if it were a plate having a uniform outermost width and an outermost length. Still preferably, the outermost length is uniform as well as the outermost width. In particular, if a semiconductor device module to be fabricated significantly varies not only in width but also in length, a semiconductor device module frame can be defined to have a fixed outermost length. As such, a common transport unit, a common magazine and the like can be more smoothly used whatever size a semiconductor device module to be fabricated has.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
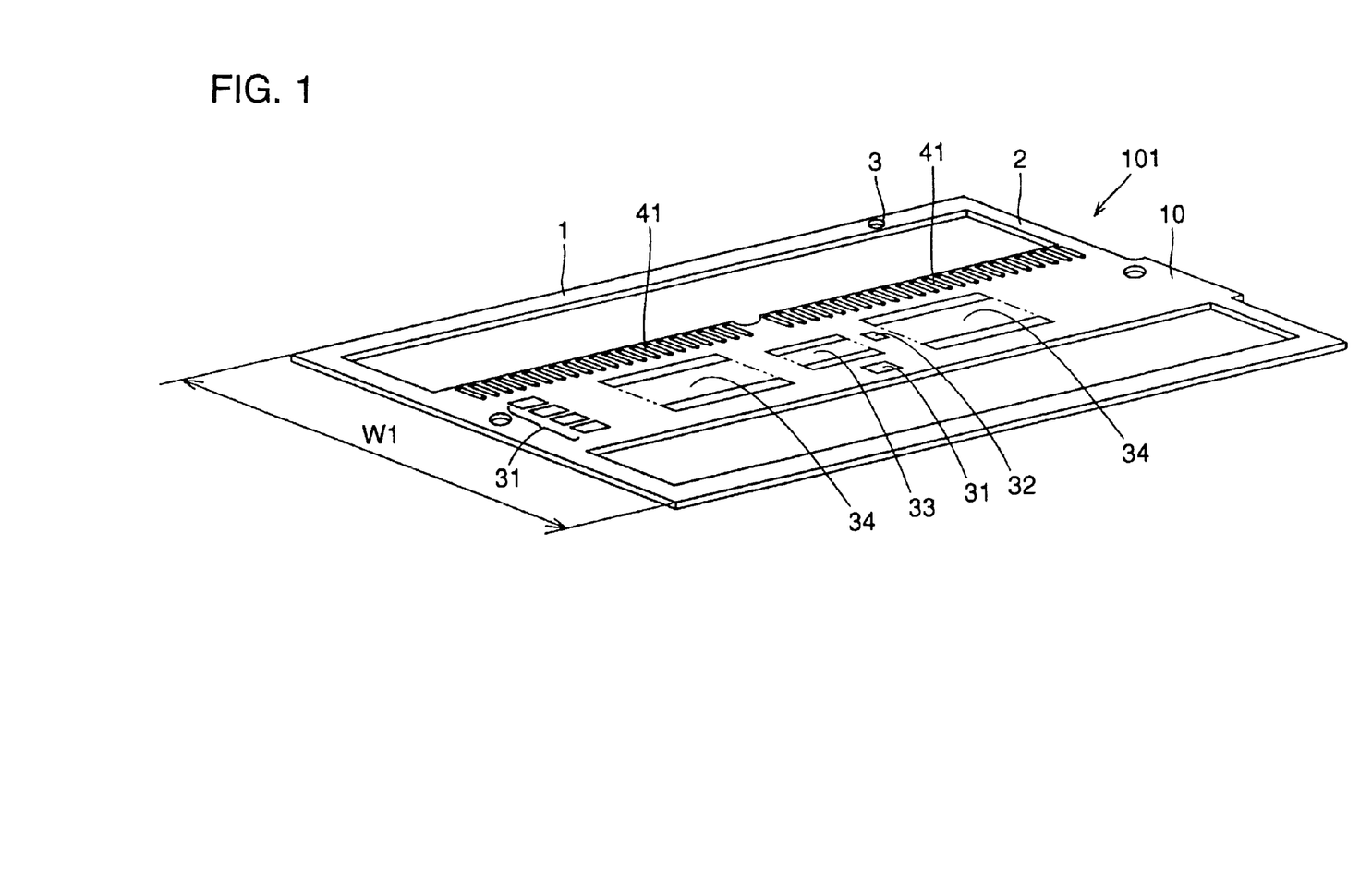
FIG. 1 is a perspective view of a semiconductor device module frame in a first embodiment of the present invention.

FIG. 1 shows a semiconductor device module frame 101 in a first embodiment of the present invention.

Semiconductor device module frame 101, as shown in FIG. 1, includes a center portion provided with a substantially rectangular, semiconductor device module fabrication area 10 for fabricating a semiconductor device module, and a framework 1 spaced from semiconductor device module fabrication area 10, as predetermined, to sandwich semiconductor device module fabrication area 10 width-wise. More specifically, framework 1 is arranged parallel to a longitudinal direction of semiconductor device module fabrication area 10 to provide an outermost width W1. Framework 1 and semiconductor device module fabrication area 10 have their relative, positional relationship fixed by a rib 2 connecting framework 1 and semiconductor device module fabrication area 10 together. Thus, framework 1 defines the outermost width. In the FIG. 1 example, frame 101 has outermost width W1.

As shown in FIG. 1, framework 1 is provided with a positioning hole 3.

As shown in FIG. 1, semiconductor device module fabrication area 10 is similar to a conventional substrate 9 (shown in FIG. 8), having a surface provided with an external connection terminal 41, a capacitor mounting region 31 and 32, an IC mounting region 33 and 34, and the like.

Semiconductor device module frame 101 described with reference to FIG. 1 is used in fabricating a semiconductor device module, as described hereinafter.

Figure 2A:
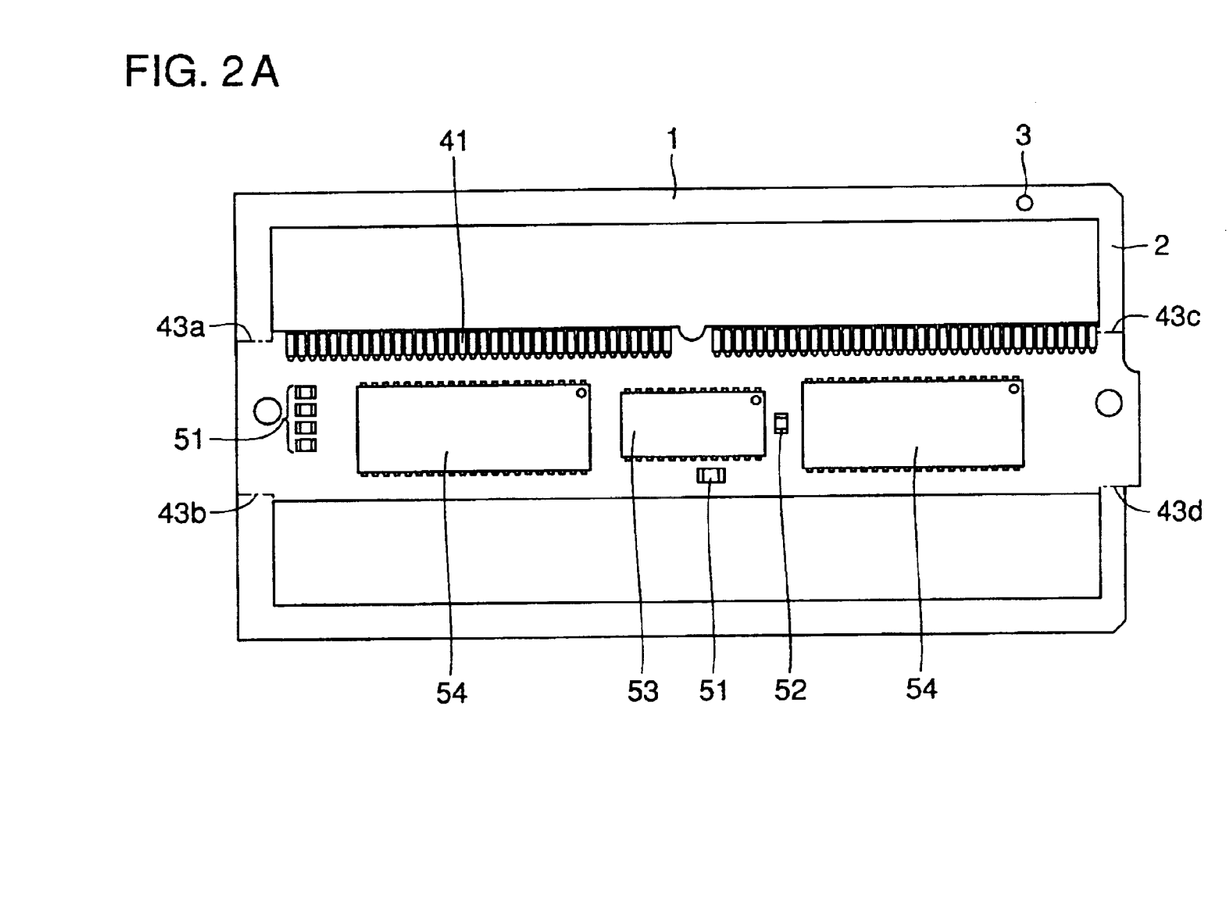
FIGS. 2A and 2B are a plan view and a side view, respectively, showing an intermediate step of a process for fabricating a semiconductor device module using the semiconductor device module frame of the first embodiment.
Figure 2B:
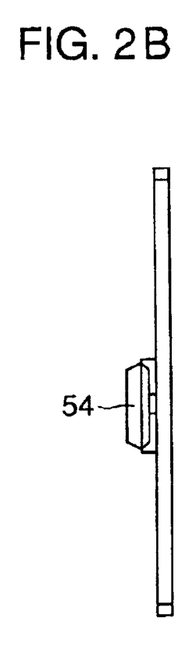

Initially, various electronic components are mounted in process steps, as will now be described. Semiconductor device module frame 101 housed in magazine 18 is extracted automatically one by one. A handler (not shown) is used to hold frame 101 at framework 1 and position frame 101 on a processing machine at a mounting area, as predetermined, via positioning bole 3. A robot or the like is used to automatically pick up an electronic components previously fed in a vicinity of the mounting area and automatically mount the electronic component on the frame 101 surface at a predetermined position. The resultant product is shown in FIGS. 2A and 2B. Capacitors 51 and 52 are mounted in capacitor mounting regions 31 and 32 and ICs 53 and 54 are mounted in IC mounting regions 33 and 34.

Figure 3A:
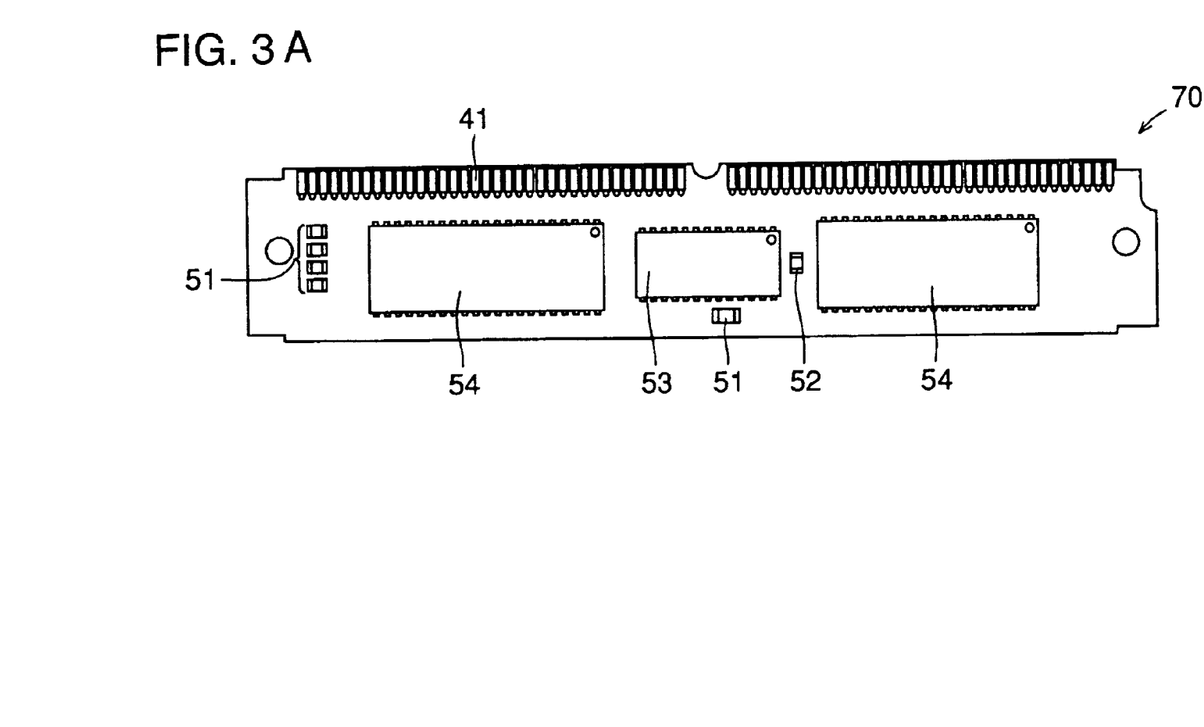
FIGS. 3A and 3B are a plan view and a side view, respectively, showing a semiconductor device module fabricated using the semiconductor device module frame of the first embodiment.
Figure 3B:
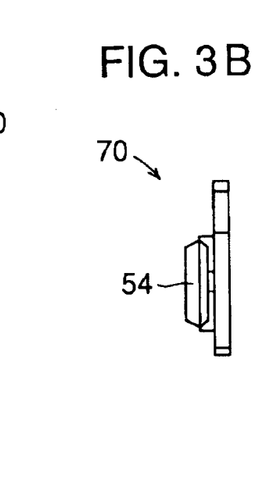

Then the frame is cut in a process step as will now be described. A shearing cutter or an R puncher is used to cut the frame along cutting lines 43a–43d as shown in FIG. 2A. Thus cut, semiconductor device module fabrication area 10 is extracted as a semiconductor device module 70, as shown in FIGS. 3A and 3B.

Figure 4A:
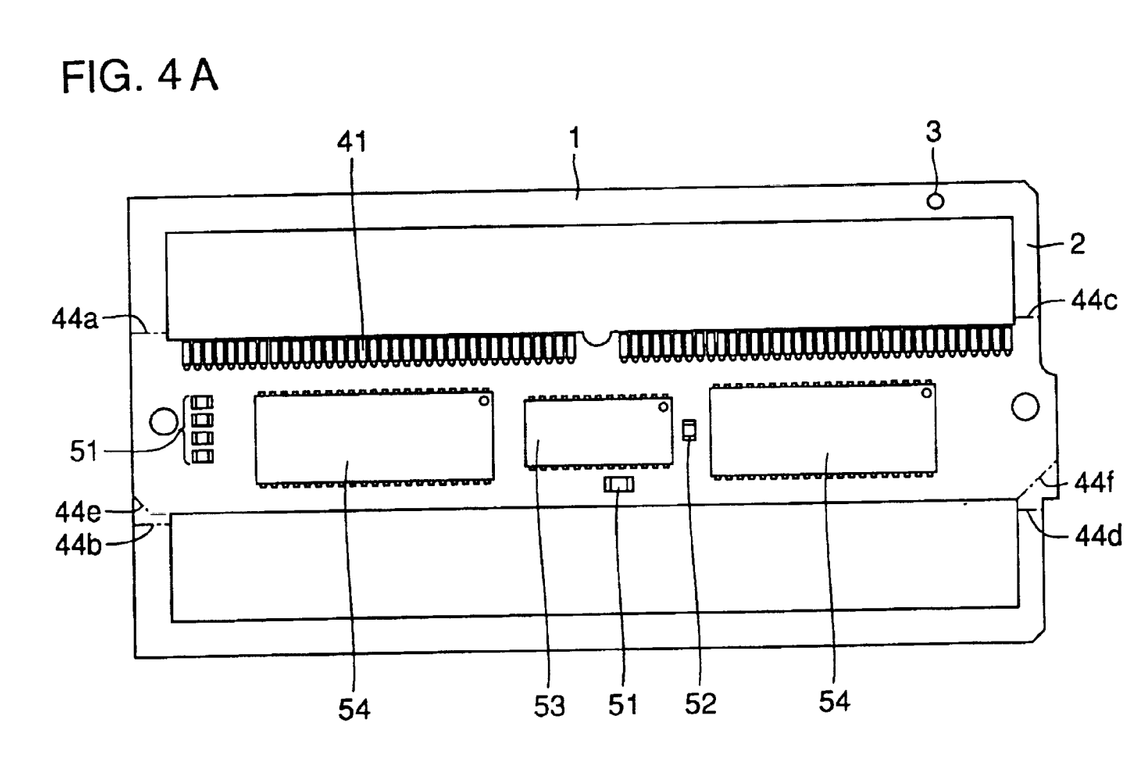
FIGS. 4A and 4B are a plan view and a side view, respectively, showing another exemplary intermediate step of a process for fabricating a semiconductor device module using the semiconductor device module frame of the first embodiment.
Figure 4B:
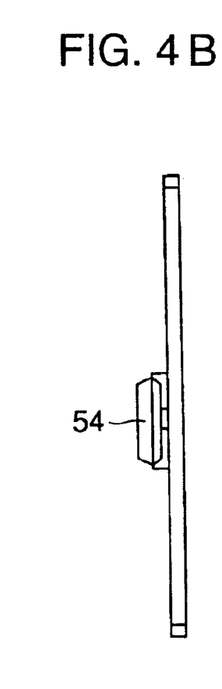

In the above example, the frame is cut along cutting lines 43a–43d slightly ingressing into semiconductor device module fabrication area 10 to extract semiconductor device module 70. However, as shown in FIG. 4A, the frame may be cut along cutting lines 44a–44d provided on rib 2 slightly outer than semiconductor device module fabrication area 10 to extract semiconductor device module 70. Alternatively, the frame may be cut along cutting lines 44a, 44c, 44e, 44f, some of which are outer than area 10 and the other of which ingress into area 10. In any example, the frame may be cut at any portion that is selected to be sufficiently distant from external connection terminal 41. As such, a rib or a portion thereof connected to area 10 is cut to prevent external connection terminal 41 from being functionally damaged for example when cutting the frame results in a deformed substrate or the frame is cut at an erroneous position.

Each semiconductor device module frame can be provided with framework 1 to define its outermost width regardless of the size of its semiconductor device module fabrication area. It can be handled with framework 1 defining the geometry thereof as a single plate. As such, if the frame has uniform outermost width W1, there can be consistently used a transport unit and a handler set to be able to transport and handle any plate of W1 in width and, as shown in FIG. 6, magazine 18 having a housing portion with width W corresponding to width W1. Furthermore, it is not necessary to produce any other component corresponding in size to a semiconductor device module such as when a holder is used. As such, if a semiconductor device module varies in form any extra cost is not required.

To fabricate different forms of semiconductor device modules, a group of multiple semiconductor device module frames having a uniform outermost width can be fed on a production line. The uniform outermost width has a single value or a plurality of limited values arranged in a graduated series. If semiconductor device modules to be fabricated are significantly different in size, setting several reference values to provide a plurality of limited values arranged in a graduated series, is preferable as it can save a cost for a source material and eliminate a cutting step.

Successively feeding on a production line a group of semiconductor device module frames that are uniform as described above, allows production equipment to be continuously operated without stopping the production line if a semiconductor device module to be fabricated varies in size.

While in the above description framework 1 is arranged parallel to the length of semiconductor device module fabrication area 10 to sandwich area 10 width-wise, frame work 1 may alternatively be arranged parallel to a direction perpendicular to the length of area 10 to sandwich area 10 length-wise. In this example, the frame has an outermost width defined in a direction perpendicular to the length of area 10.

Second Embodiment

Figure 5:
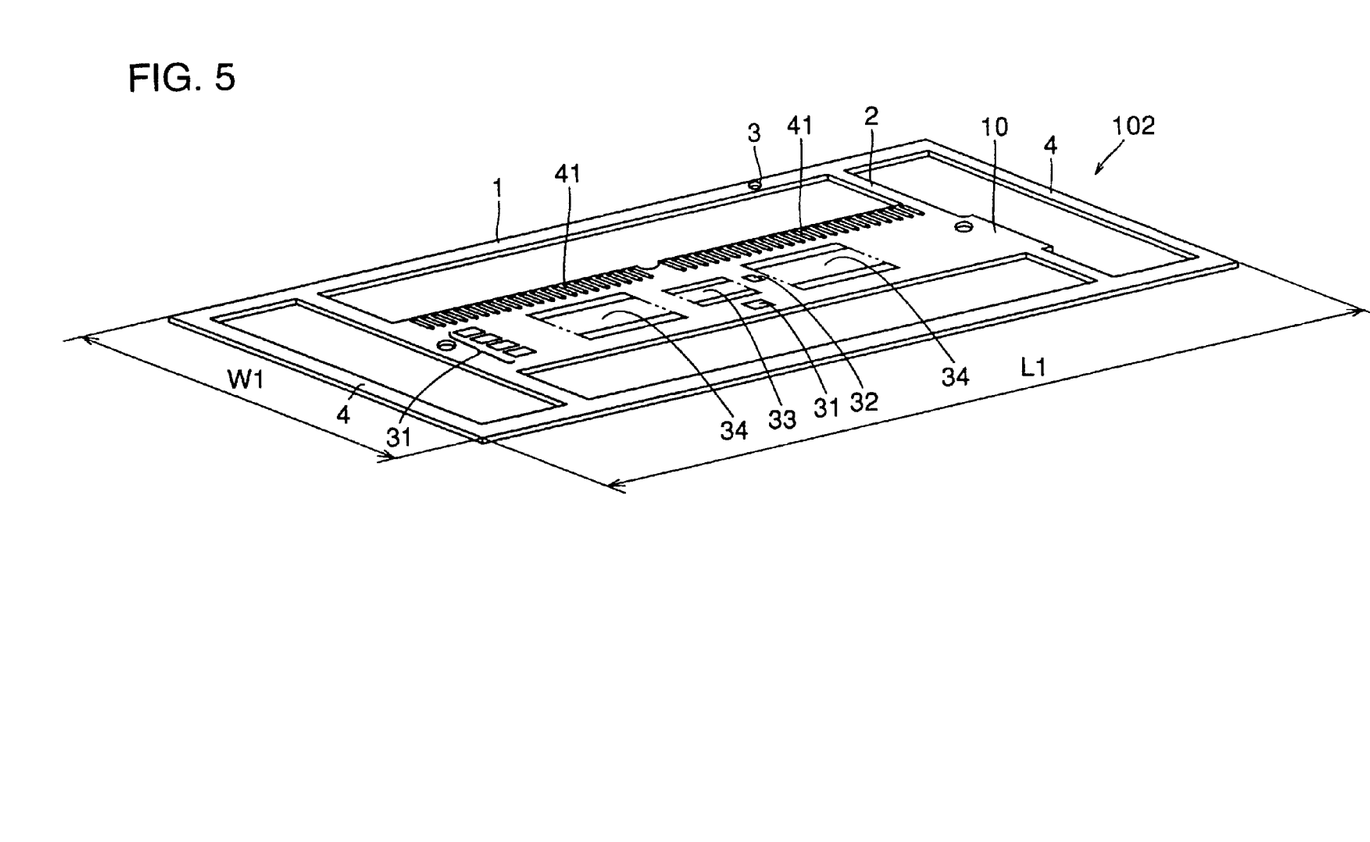
FIG. 5 is a perspective view of a semiconductor device module frame in a second embodiment of the present invention.

FIG. 5 shows a semiconductor device module frame 102 in a second embodiment of the present invention.

Semiconductor device module frame 102, as shown in FIG. 5, is basically similar to the FIG. 1 frame 101, although frame 102 has an auxiliary framework 4 spaced as predetermined from semiconductor device module fabrication area 10 to sandwich area 10 length-wise. More specifically, auxiliary framework 4 is arranged parallel to a width of semiconductor device module fabrication area 10 to define an outermost length of the frame. In the FIG. 5 example the outermost length is denoted by L1.

Providing the auxiliary framework can define an outermost length of a frame regardless of the size of the semiconductor device module fabrication area of the frame. Providing uniform outermost length L1 in addition to uniform outermost width W1 allows the frame to be handled as a plate of L1 in length and W1 in width. As such, a transport unit, a handler, a magazine and the like set to handle such size can be used consistently. As a result, such an effect as described in the first embodiment can be achieved. Furthermore, as compared to the first embodiment, the frame can also have a uniform length and if a group of semiconductor device module frames that are uniform in outermost length as well as outermost width are used they can be handled more readily and if a semiconductor device module significantly varying in size is to be fabricated production equipment can continuously operate without stopping the production line.

The present invention can provide a semiconductor device module frame with a semiconductor device module fabrication area sandwiched by a framework in two directions to define the frame's outermost width. As such, the frame can have a uniform outermost width and it can thus be handled as a plate having a fixed, uniform outermost width. Furthermore, a group of semiconductor device module frames that are uniform in outermost width allows a common transport unit, a common magazine and the like to be used whatever size a semiconductor device module to be fabricated has. As such, if a semiconductor device module to be fabricated varies in size it is not necessary to stop the production line and the production line can thus operate continuously.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device module frame comprising:
   a semiconductor device module fabrication portion including a substrate for fabricating a semiconductor device module and on which at least one multiple pin integrated circuit is mounted, said semiconductor device module fabrication portion having a pair of lengthwise sides and ends transverse to said lengthwise sides; and
   a framework integral with and located on opposite sides of said semiconductor device module fabrication portion, said framework including,
      at each of said lengthwise sides of said device module fabrication portion, respective longitudinal sides spaced from and opposite respective lengthwise sides of said semiconductor device module fabrication portion and
      pairs of ribs connecting said respective longitudinal sides of said framework to said semiconductor device module fabrication portion at said ends of said semiconductor device module fabrication portion, establishing fixed relative positional relationships between said framework and said semiconductor device module fabrication portion, wherein said longitudinal sides define an outermost width of said frame, the outermost width being uniform alone said lengthwise sides of said semiconductor device module fabrication portion.

2. The semiconductor device module frame according to claim 1, further comprising positioning means for positioning said semiconductor device module fabrication portion during processing of said semiconductor device module fabrication portion.

3. The semiconductor device module frame according to claim 2, wherein said positioning means is a positioning hole.

4. The semiconductor device module frame according to claim 3, wherein the positioning hole is located in one of said longitudinal sides.

5. The semiconductor device module frame according to claim 1, wherein severing said ribs separates said semiconductor device module fabrication portion from said semiconductor device module frame and produces a semiconductor device module.

6. The semiconductor device module frame according to claim 5, wherein said semiconductor device module fabrication portion includes an external connection terminal for making external connections to said semiconductor device module, said external connection terminal being separated from said ribs to prevent said external connection terminal from being functionally affected by cutting of said ribs.

7. A group of semiconductor device module frames, the group including:
   a plurality of semiconductor device module frames for fabricating, in a plurality of forms having different dimensions, semiconductor device modules having respective substrates of different areas on which at least one multiple pin integrated circuit is mounted, each of said semiconductor device module frames including:
   a semiconductor device module fabrication portion for fabricating a semiconductor device module and including a substrate on which at least one multiple pin integrated circuit is mounted, said semiconductor device module fabrication portion having a pair of lengthwise sides and ends transverse to said length wise sides; and
   a framework integral with and located on opposite sides of said semiconductor device module fabrication portion, said framework including,
      at each of said lengthwise sides of said device module fabrication portion, respective longitudinal sides spaced from and opposite respective lengthwise sides of said semiconductor device module fabrication portion and
      pairs of ribs connecting said respective longitudinal sides of said framework to said semiconductor device module fabrication portion at said ends of said semiconductor device module fabrication portion, establishing fixed relative positional relationships between said framework and said semiconductor device module fabrication portion, wherein
         said longitudinal sides of respective frames define outermost widths of the respective frames,
         the outermost widths of said plurality of semiconductor device module frames are uniform, and
         areas of said substrates and dimensions of said ribs of respective semiconductor device module frames are not uniform.

8. The group of semiconductor device module frames according to claim 7, wherein each of said semiconductor device module frames also includes positioning means for positioning said semiconductor device module fabrication portion of said semiconductor device module frame during processing of said semiconductor device module fabrication portion.

9. The group of semiconductor device module frames according to claim 8, wherein said positioning means is a positioning hole in each semiconductor device module frame.

10. The group of semiconductor device module frames according to claim 9, wherein the positioning hole is located in one of said longitudinal sides of each semiconductor device module frame.

11. The group of semiconductor device module frames according to claim 7, wherein, in each of said semiconductor device module frames, severing said ribs separates said semiconductor device module fabrication portion from said semiconductor device module frame including said semiconductor device module fabrication portion and produces a semiconductor device module.

12. The group of semiconductor device module frames according to claim 11, wherein, in each of said semiconductor device module frames, said semiconductor device module fabrication portion includes an external connection terminal for making external connections to said semiconductor device module, said external connection terminal being separated from said ribs to prevent said external connection terminal from being functionally affected by cutting of said ribs.

13. The semiconductor device module frame according to claim 1, wherein said semiconductor device module fabrication portion and said framework lie in a plane.

14. The group of semiconductor device module frames according to claim 7, wherein each of said semiconductor device module frames is planar.

* * * * *